United States Patent
Bandy et al.

(10) Patent No.: US 7,180,437 B1
(45) Date of Patent: Feb. 20, 2007

(54) PARALLEL-TO-SERIAL CONVERTER

(75) Inventors: Paul W. Bandy, Kent, WA (US);
Darrell W. Gaston, Everett, WA (US);
Toan D. Le, Lynnwood, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 11/196,691

(22) Filed: Aug. 3, 2005

(51) Int. Cl.
H03M 1/00 (2006.01)

(52) U.S. Cl. .................. 341/126; 341/101; 341/110

(58) Field of Classification Search ........... 341/110, 341/126
See application file for complete search history.

(56) References Cited

U.S. PATENT DOCUMENTS

| | | | | |
|---|---|---|---|---|
| 4,266,274 A | * | 5/1981 | Barman | 701/108 |
| 4,729,102 A | * | 3/1988 | Miller et al. | 701/14 |
| 5,063,383 A | * | 11/1991 | Bobba | 341/120 |
| 5,416,480 A | * | 5/1995 | Roach et al. | 341/61 |
| 5,424,949 A | * | 6/1995 | Applegate et al. | 701/14 |
| 5,432,949 A | * | 7/1995 | Baba | 712/39 |
| 6,144,327 A | * | 11/2000 | Distinti et al. | 341/126 |
| 6,384,753 B1 | * | 5/2002 | Brooks et al. | 341/118 |
| 6,448,914 B1 | * | 9/2002 | Younis et al. | 341/141 |
| 6,587,056 B1 | | 7/2003 | Fraser et al. | |
| 6,739,145 B2 | * | 5/2004 | Bhatnagar | 62/127 |
| 6,812,871 B2 | * | 11/2004 | Wu | 341/99 |
| 2005/0253744 A1 | * | 11/2005 | Kern | 341/110 |

* cited by examiner

Primary Examiner—Khai M. Nguyen
(74) Attorney, Agent, or Firm—Klein, O'Neill & Singh, LLP; Tejinder Singh

(57) ABSTRACT

Method and system on an aircraft for converting plural data inputs and plural data outputs from a parallel format to a serial format is provided. The system includes an integrated software module that accepts plural variable number of inputs and generates a plural variable number of outputs; an analog input processing module that receives plural analog inputs, converts the analog inputs to digital data and sends the digital data to the integrated software module; a digital input processing module that receives discrete digital inputs and transfers the digital inputs to the integrated software module; a digital output module that receives data from the integrated software module; and an analog output module that receives digital data from the integrated software module and converts the digital data into analog data by using a digital to analog converter.

6 Claims, 9 Drawing Sheets

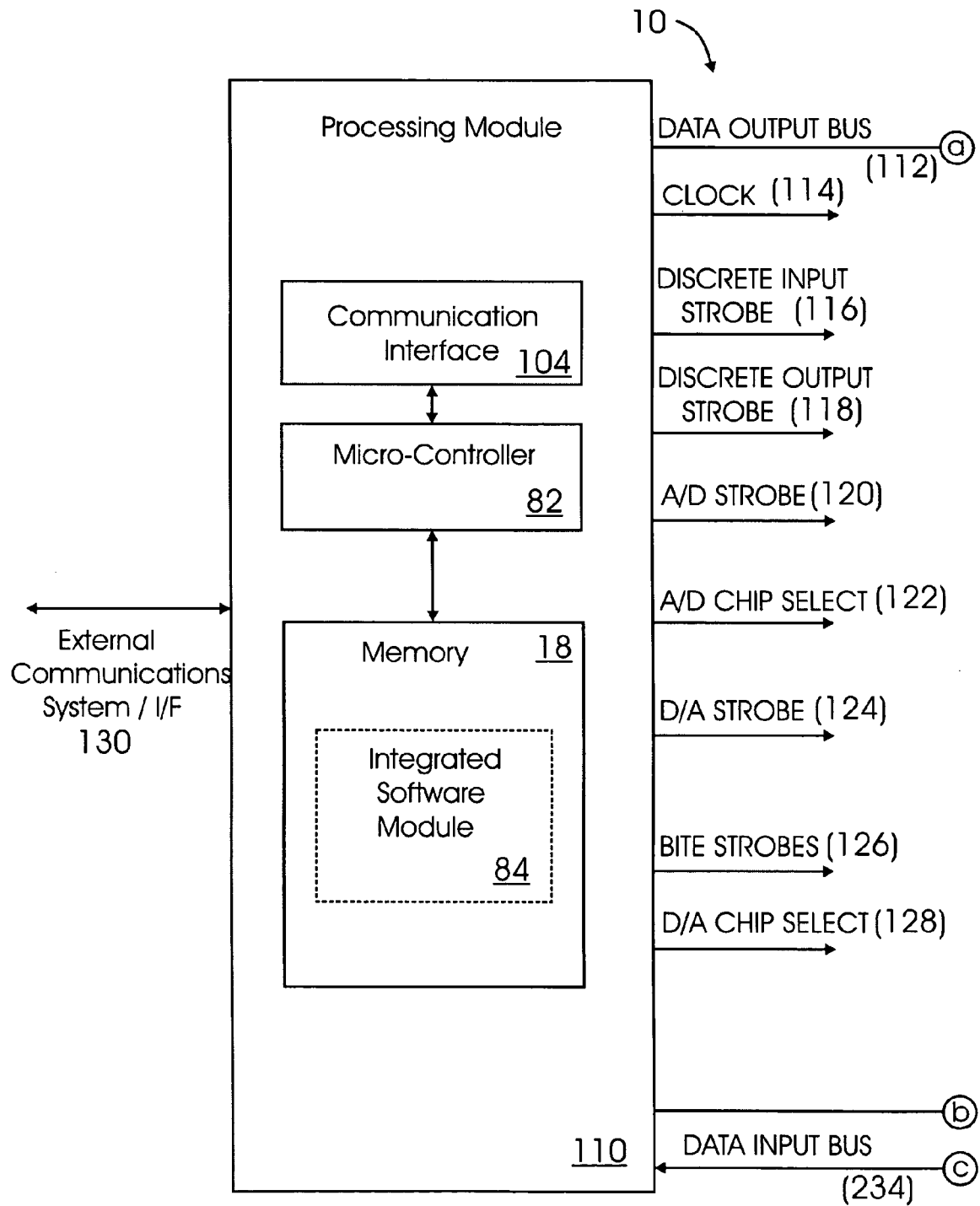
Figure 1[i]

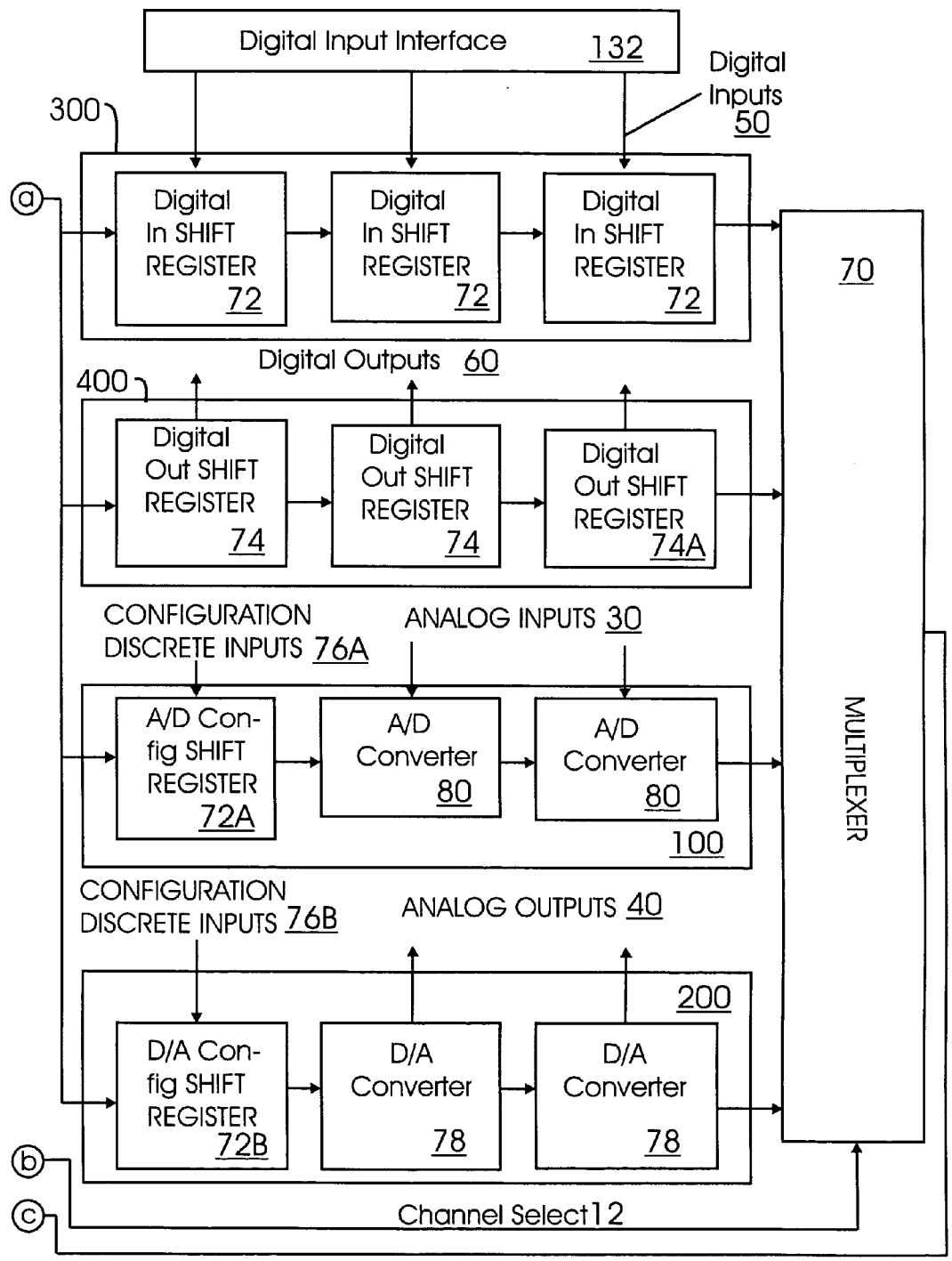
Figure 1[ii]

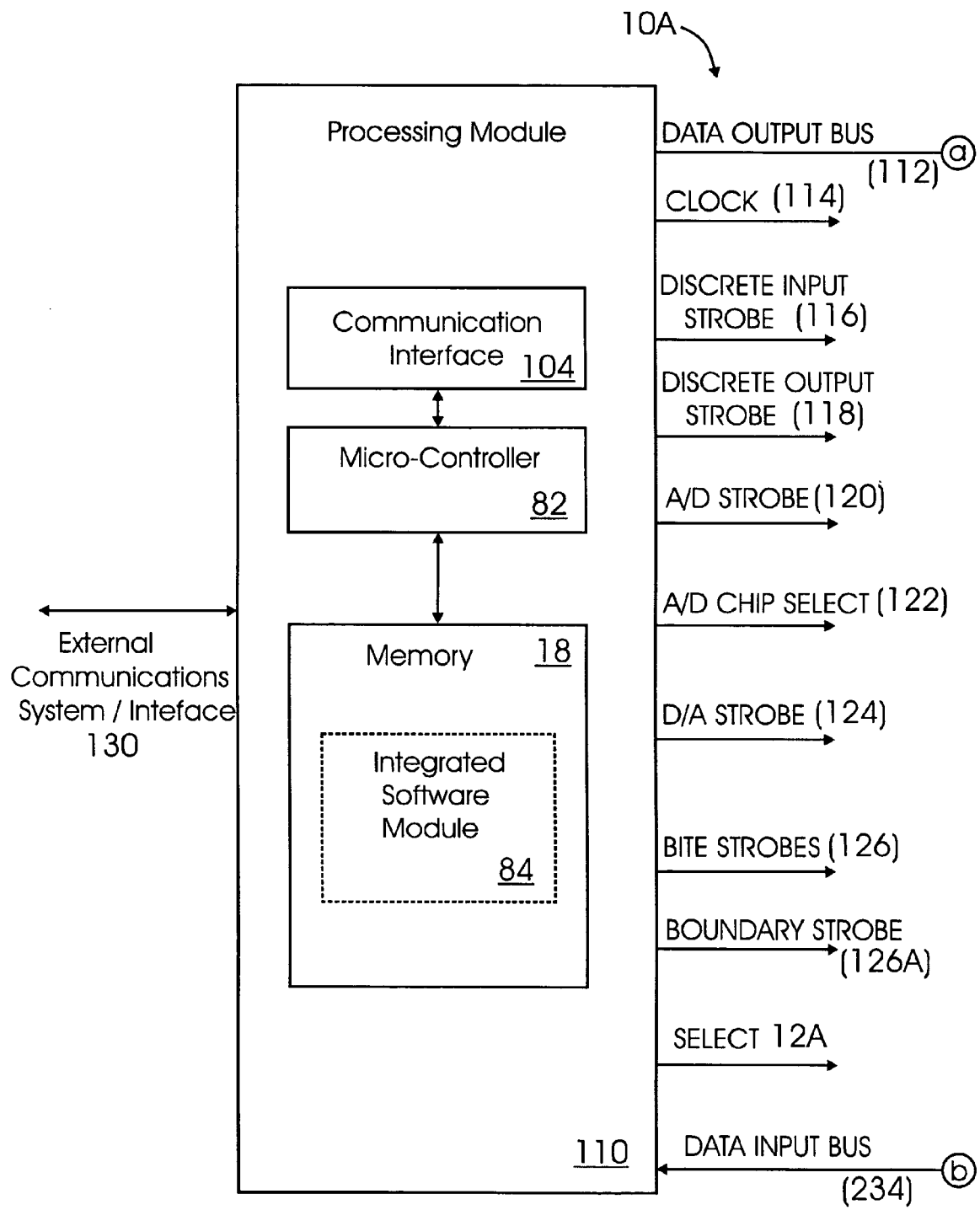
Figure 2[i]

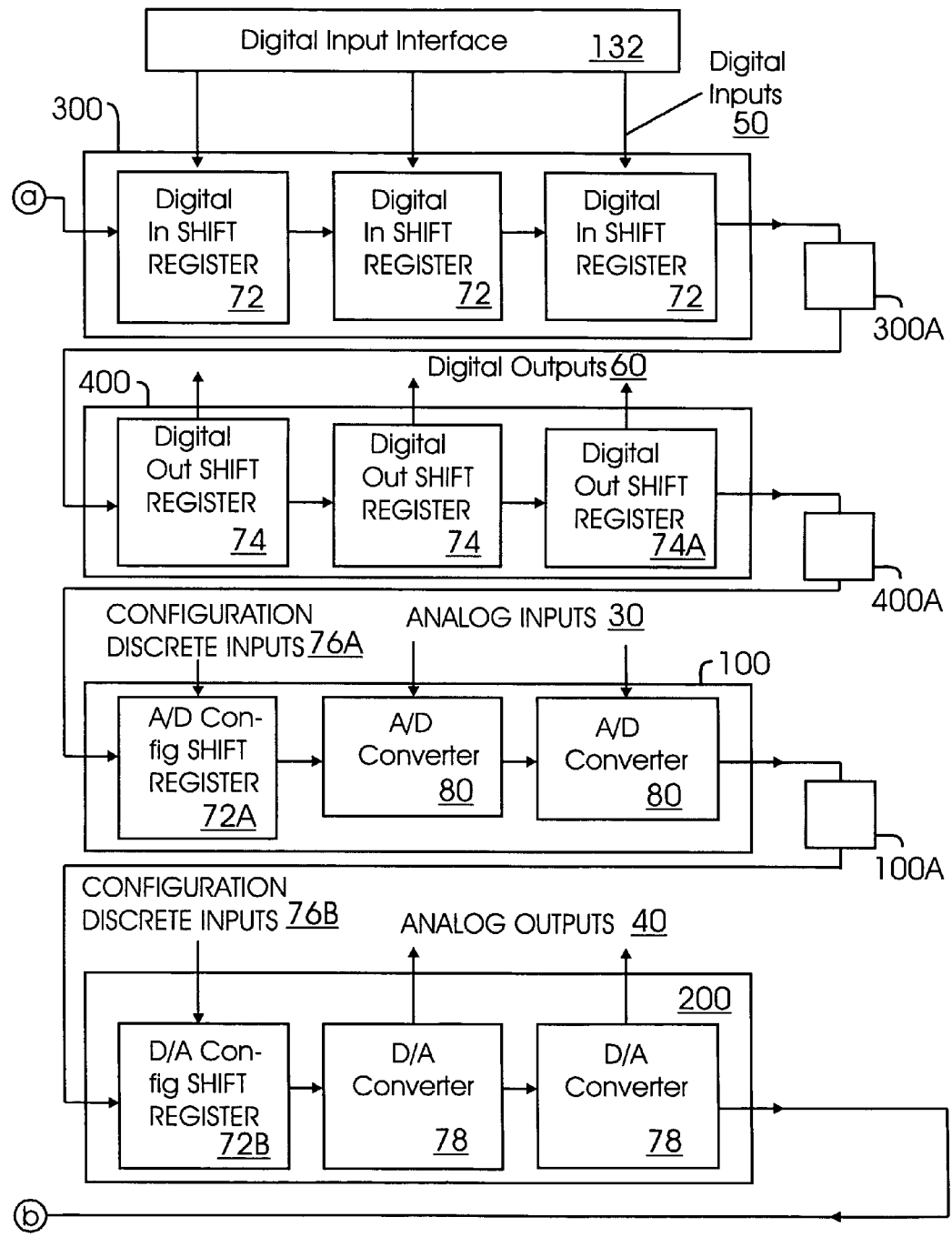
Figure 2[ii]

PARALLEL-TO-SERIAL CONVERTER

BACKGROUND OF THE INVENTION

1. Field of the Invention

The present invention relates to a system and method for processing different input and output types, and particularly to a system and method of using a scalable software module for processing discrete input/output types from a parallel format to a serial format.

2. Background

Conventional commercial airplane panels, such as those found on a Boeing 777®, have many individual flight deck modules in which each module uses a large number of switches and annunciators. These switches and annunciators have multiple analog inputs and outputs as well as digital inputs and outputs. Different types of inputs and outputs contribute to design complexity, increased components and module cost.

For example, using a high number of inputs and outputs require additional hardware, such as, an increased number of module connector pins and wire harnesses. The large number of pins needed for conventional flight deck modules also requires large amounts of printed circuit board space.

Software (includes firmware) is generally used for processing various input/output types involving flight deck modules. Software development costs are extremely high in avionics. Indeed, the software necessary for controlling conventional flight deck modules with a large number of inputs and outputs may be more costly than the hardware.

To accommodate several modules with various numbers of inputs and outputs, separate software is needed for each module having a different number of inputs and outputs. Thus when one module (with a number of inputs and outputs) is exchanged for a different module (with a different number of inputs and outputs), the associated software must be modified. Such software modifications increase the overall design costs associated with designing/upgrading aircrafts.

Therefore, what is desired is a system that can efficiently process inputs and outputs from plural sources using an integrated/scalable software module.

SUMMARY OF THE INVENTION

In one aspect of the present invention, a system on an aircraft for converting plural data inputs and plural data outputs from a parallel format to a serial format is provided. The system includes, a microcontroller for executing code out of a memory module; an integrated software module that accepts plural variable number of inputs and generates a plural variable number of outputs; an analog input processing module that receives plural analog inputs, converts the analog inputs to digital data and sends the digital data to the integrated software module; a digital input processing module that receives discrete digital inputs and transfers the digital inputs to the integrated software module; a digital output module that receives digital data from the integrated software module; and an analog output module that receives digital data from the integrated software module and converts the digital data into analog data by using a digital to analog converter.

In another aspect of the present invention, a method for processing plural data inputs and data outputs from a parallel to a serial format is provided. The method includes, receiving analog inputs, wherein an analog processing module receives the analog inputs; converting the analog inputs to a digital format; transferring the converted analog inputs to an integrated software module; and processing the converted analog inputs, wherein the integrated software module processes the converted analog inputs based on a destination format.

The method also includes, receiving digital inputs, wherein a digital input processing module receives digital inputs and transfers the digital inputs to the integrated software module.

Also, a digital output processing module receives digital data from the integrated software module and transfers the digital data to a destination; and an analog output module receives digital data from the integrated software module, converts the digital data to an analog data format and then transfers the analog data to a destination.

This brief summary has been provided so that the nature of the invention may be understood quickly. A more complete understanding of the invention can be obtained by reference to the following detailed description of the preferred embodiments thereof in connection with the attached drawings.

BRIEF DESCRIPTION OF THE DRAWINGS

The foregoing features and other features of the present invention will now be described with reference to the drawings of a preferred embodiment. In the drawings, the same components have the same reference numerals. The illustrated embodiment is intended to illustrate, but not to limit the invention. The drawings include the following Figures:

FIG. 1 is a block diagram of a system for converting data inputs and data outputs from a parallel format into a serial format, according to an embodiment of the present invention;

FIG. 2 is a block diagram of a system for converting data inputs and data outputs from a parallel format into a serial format, according to another embodiment of the present invention;

DETAILED DESCRIPTION OF THE PREFERRED EMBODIMENTS

Figure 3:
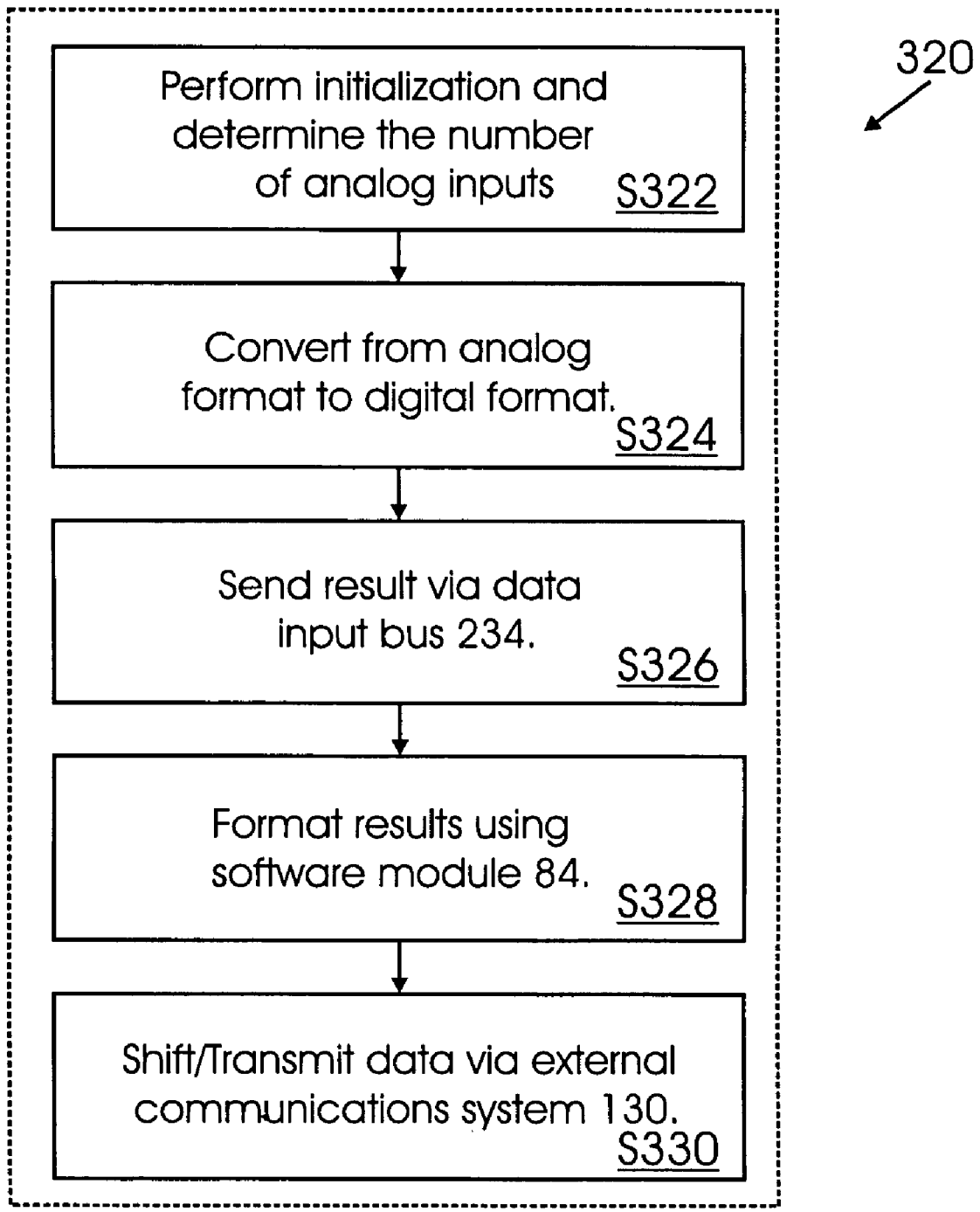
FIG. 3 is a flow chart of a method for processing analog inputs, according to another embodiment of the present invention.

The following detailed description is of the best currently contemplated modes of carrying out the invention. The detailed description is not to be taken in a limiting sense. The detailed description is made merely for the purpose of illustrating the general principles of the invention, since the scope of the invention is best defined by the appended claims.

The present invention provides a system that can be used in aircrafts for converting analog and digital inputs from a parallel format to a serial format by using a scalable software module. Such analog and digital inputs may originate from various flight deck modules on an aircraft that are used for plural functions. For example, the flight deck modules may be used to control aircraft systems, such as climate control, air conditioning, electrical power systems, window heat, pass signs, anti-ice systems, hydraulics, cargo heat, anti-collision, bleed air, and fuel jettisoning systems.

Although the present invention is described in the context of serving aircraft flight deck modules, it is to be understood that the present invention is also useful for applications, including but not limited to, military tanks, maritime vessels, space craft, missile, and other vehicles.

In one aspect, the present invention enables an integrated software module to convert plural parallel inputs into a serial format. The software module processes various inputs/outputs, for example, digital discrete inputs, discrete outputs, analog discrete inputs, and analog outputs to a serial format. The software module is scalable and allows addition of future inputs from plural sources. The integrated software module has a modular structure, which allows addition of drivers/code to process inputs from a variety of sources.

At system power up, the number of input devices and pins are determined, as described below in detail. The number of inputs and input types determines how data is packed on an output serial bus, during normal operation.

All inputs and outputs may be received on a bus (such as an RS485 bus). In one aspect, a microcontroller is used to convert serial data to discrete inputs, discrete outputs, analog inputs, or analog outputs, as described below in detail.

A particular output (analog or digital) is not necessarily associated with a particular input (analog or digital). A microcontroller that processes the input and output signals uses a modular software program coded in a way to work with a variety of input and output signal types. As technology changes and more hardware is added providing different inputs, the core software program code stays the same or is simply upgraded to handle future input types.

Overall System:

FIG. 1 shows a block diagram of an exemplary system 10 for converting data inputs from a parallel format to a serial format and data outputs from a serial format to a parallel format, according to one aspect of the present invention. System 10 communicates with external locations (including locations within an aircraft) via an external communications system (or interface or bus) 130 (for example, an Ethernet-based or an RS485-based network). The external communications system 130 includes a communication bus driver and a high speed serial bus.

System 10 includes a processing module 110 (may also be referred to as module 110 or "processing hardware block" 110) for interfacing with the external communications system 130. Module 110 includes a communication interface 104, and a microcontroller 82 coupled via a local internal bus (not shown). Communication interface 104 is used by module 110 for receiving inputs and transmitting outputs.

Module 110 controls plural devices/components using a serial data bus 112 and 234 (shown as data output bus 112 and data input bus 234, respectively). The microcontroller 82 has access to local memory module 18 (that may be random access memory, read only memory, or any another type of memory) that stores a software module 84 (or firmware, used interchangeably throughout this specification) for processing various inputs/outputs, as described below.

The software module 84 uses a modular software program that allows expandable inputs and outputs. The software module 84 provides computer software program/instructions for processing and communicating data from various analog inputs 30, and digital inputs 50 and processing and communicating various analog outputs 40 and digital outputs 60.

It is noteworthy that the present invention is not limited to using any particular type or number of microcontroller(s) or processor(s) as shown in FIG. 1. In another aspect, a state machine or an application specific integrated circuit/field programmable gate array (FPGA) can be used to achieve similar results as described herein.

System 10 also includes a multiplexer 70 (may also be referred to as "Mux 70") containing a type of multiplexer circuit as is typically used for selecting data to combine two or more signals onto a single line, by placing the signals onto the single line at different times. Mux 70 is operationally connected to an analog-to-digital converter (A/D converter) 80 (module 100), a digital-to-analog converter (D/A converter) 78 (module 200) and various registers (digital in-shift register 72 (module 300) and digital out shift register 74 (module 400)) as shown in FIG. 1 and described below. Registers 72 and 74 may be loadable, i.e., parallel in and serial out type registers.

System 10 includes various modules (or interface units, used interchangeably throughout this specification) to process different types of inputs and outputs. For example, analog inputs 30 are processed by analog input processing module 100 (module 100), analog outputs are processed by analog output processing module 200 (module 200); discrete digital inputs are handled by digital input processing module 300 (module 300) and digital outputs are handled by digital output processing module 400 (module 400). The various modules are described below in detail.

At power up (i.e. when system 10 is initialized), module 110 selects a multiplexer 70 channel. Module 110 receives zero's (0s) or ones (1s) associated with a particular channel via bus 234. Microcontroller 82 then determines the length/type of the data input for every module (i.e. 100, 200, 300 and 400).

As part of system 10 initialization, the number of input/output ("I/O") bits is determined. First a multiplexer channel associated with the I/O type is selected using the channel select signal 12. Next, zeroes (or ones (1s)) are shifted through the shift registers and/or converters associated with the selected channel. Finally, a walking one (1) (or zero (0)) is shifted through to determine the length of the shift registers. For the digital inputs (in module 300), the microcontroller (82) changes the CHANNEL SELECT signal 12 to select the digital input channel of the multiplexer 70 so that the output of the right most digital input shift register (shown as 74A) is connected to the data input bus 234. The microcontroller (82) fills the digital input shift registers with zeros (or 1s) by clocking in a long string of zeros (or 1s) using the data output bus 112 and clock 114. The length of zeroes (or 1s) used is a large number representing the longest shift register that could be implemented. The shift register length is determined by clocking in ones to form a walking one (or zero) pattern. As discussed above either zero or one can be used to ascertain the number of input/outputs.

A/D converters 80 (and D/A converters 78) often require a chip select signal for serial synchronization and a strobe to initiate conversion. For example, an A/D Strobe 120 and an A/D chip select signal 122 are provided for selecting the A/D converters 80. Microcontroller 82 sends A/D chip select signal 122 and A/D strobe signal 120 to select A/D converter(s) 80. Likewise, a D/A strobe 124 signal and D/A chip select signal 128 is used by microcontroller 82 to select D/A converters 78 for converting digital data into analog data. It is noteworthy that D/A select strobe and signals, and A/D select and strobe signals may not be needed depending on the type of A/D and/or D/A converter that is being used by modules 100 and 200, respectively.

System 10 also uses byte strobe signals, such as bite strobes 126, to simulate inputs for built-in testing. Bite (built-in test equipment) testing can be performed through the external communications interface 130 by using some of the digital inputs 50 or the analog inputs 30 as monitors for the digital outputs 60 or the analog outputs 40.

Turning in detail to FIG. 1, analog inputs 30 are processed using module 100. Analog inputs 30 may originate from various devices/sources including without limitation flight deck modules (not shown)/integrated flight deck panel. For example, an analog input may be from a flight deck module (not shown) for initiating an air conditioning system (not shown).

Analog input processing module 100 includes a configuration register (A/D configuration register 72A) (may also be referred to as register 72A). Register 72A is configured by configuration discrete input(s) 76A (may also be referred to as "inputs"). Input 76A is a hard-wired input that specifies the type of A/D converter 80 used for converting analog data to digital format. A/D configuration shift register 72A includes an integral input latch (not shown) that is loaded using a discrete input strobe 116 (such as 74HC597). After register 72A is configured, analog inputs 30 are converted to a digital format by the A/D converter 80 and then sent to module 110 via multiplexer 70 and data input bus 234. Software module 84 processes the received digital data. This data is then output via the external communications system 130. The output can be used to produce various instructions, for example, to initiate an air conditioning system (not shown). It is noteworthy that external communications system 130 can be used to receive and send data inputs in plural formats. Integrated software module 84 and the systems shown in FIGS. 1 and 2 can handle various inputs/outputs using external communication system 130.

Analog output processing module 200 outputs analog outputs 40 (for example, for light intensity controls). Module 200 includes a D/A configuration register 72B (may also be referred to as register 72B) that receives configuration input 76B (similar to register 72A and input 76A). Digital data may be received via communication system 130. Software module 84 processes/formats the data based on the output type. The digital data is then sent to D/A converters 78, via register 72B. The analog outputs 40 are then sent out to the intended destinations.

Digital input processing module 300 (also referred to as "module 300") processes digital inputs. Module 300 receives digital data inputs 50 (for example, from discrete switches), via a digital input interface 132. The digital inputs are stored in shift registers 72 and then sent to the software module 84 via data input bus 234. Software module 84 processes the digital inputs and generates an output, which is sent (shifted/transmitted) out via communication system 130. It is noteworthy that the number of in-shift registers (shown as 3 in module 300 (and also in module 400)) is not important. Any number of registers can be used to stage digital inputs 50.

Digital output module 400 is used to produce a digital output (shown as 60). Digital outputs 60 may be used for various functions, for example, to turn lights off and on. The digital in shift registers 74 associated with the digital outputs 60 have an integral output latch (not shown) that is loaded using a signal from a discrete output strobe 118, which is similar to a 74HC595.

It is noteworthy that the system 10 layout is only intended to illustrate the adaptive aspects of the present invention. An example of another system layout (10A) is shown in FIG. 2. System 10A and system 10 have various common components and modules. In system 10A, data flows serially among modules 300, 400, 100, and 200 as opposed to flowing in a parallel manner via Mux 70, as shown in system 10 of FIG. 1.

System 10A is initialized upon power up. Boundary flip-flops 300A, 400A and 100A are used to determine the boundaries between each module/interface type (i.e. modules 100, 200, 300 and 400). Upon power up, a large number (i.e. at least a number large enough to accommodate various inputs/outputs from modules 100, 200, 300 and 400) of 0s or 1s are shifted through data output bus 112. The 1s or 0s are shifted through registers 72, 74, 72A and 72B. A boundary bit is set using boundary strobe 126A in boundary flip-flops 300A, 400A and 100A. Microcontroller 82 toggles through the boundary bits and determines the number of input/output types it has to process from modules (or interface) 100, 200, 300 and 400. It is noteworthy that this information can also be pre-programmed and stored in memory 18.

Microcontroller 82 uses data output bus 112 to communicate to all the input/output devices. All the data from modules 100, 200, 300 and 400 are received/processed by microcontroller 82 via input bus 234. The functionality and operation of modules 100, 200, 300 and 400 is the same as described above with respect to FIG. 1.

Processing Analog Inputs:

FIG. 3 shows a flow chart of a method 320 for processing analog inputs 30 (shown in FIGS. 1 and 2). Microcontroller 82 reads the state of configuration discrete inputs 76A using channel select signal 12 (FIG. 1). Inputs 76A are used to determine the characteristics of A/D converters 80. The A/D characteristics can be stored in memory 18 or any other location. Channel selection and conversion is performed by using the characteristics information, data output bus 112, clock 114, A/D chip select 122, A/D strobe 120 and data input bus 234. It is noteworthy that A/D chip select and/or A/D strobe may not be needed depending on the type of A/D converter(s) 80.

Turning in detail to FIG. 3, the method 320 comprises a step S322, for determining the number of analog inputs 30 (shown in FIGS. 1 and 2) and acquiring the related configuration information for the A/D converters (such as from the configuration Register 74), upon power up. As discussed above, the configuration discrete input 76A (shown in FIGS. 1 and 2) is a hard-wired input that specifies the type of A/D converter and number of A/D converters 80 (shown in FIGS. 1 and 2). The number of analog inputs to be used may be stored in memory 18 or any other location. The number of analog inputs is used to read analog inputs 30. It is noteworthy that this step is a part of system 10/10A initialization.

In step S324, analog inputs are converted from an analog format to a digital format. As described above regarding FIGS. 1 and 2, analog inputs 30 are converted to a digital format by the A/D converters 80.

In step S326, the resulting digital data is received by software module 84 via a data input bus 234 (shown in FIGS. 1 and 2). The digital data is sent via multiplexer 70 (as shown in FIG. 1) or serially as shown in FIG. 2.

In step S328, the software module 84 (shown in FIGS. 1 and 2) processes and formats the converted digital data. The microcontroller 82 (shown in FIGS. 1 and 2) changes the format of the digital data and packs the digital data for output through the communication interface 104 (shown in FIGS. 1 and 2).

A step S330 comprises transmitting/sending/latching/shifting (used interchangeably throughout this specification) the data via an external communications system 130 (shown in FIGS. 1 and 2) to the appropriate destination.

Figure 4:
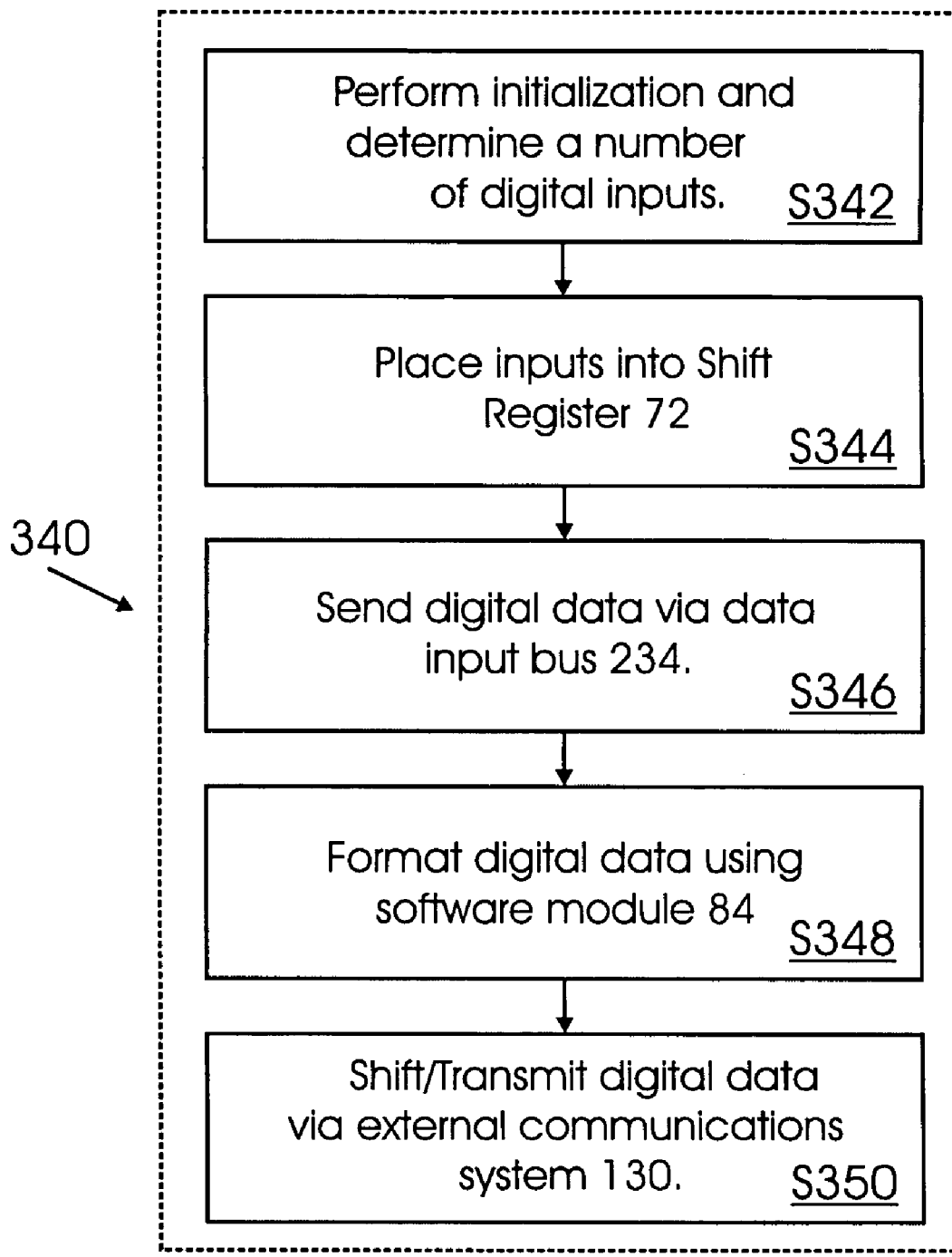
FIG. 4 is a flow chart of a method for processing digital inputs, according to another embodiment of the present invention.

Processing Digital Inputs:

FIG. 4 shows a flow chart of a method 340 for processing digital inputs 50 (shown in FIGS. 1 and 2). The digital inputs 50 may be sent from discrete switches (not shown) to register 72 (shown in FIGS. 1 and 2) via a digital input interface 132 (shown in FIGS. 1 and 2). Channel select signal 12 is set up to select the discrete digital data in shift registers (72). The discrete input strobe 116 is pulsed to latch the state of the digital input interface 132 into digital in shift registers 72. A clock pulse is generated using clock signal 114. The state of data input bus 234 is acquired and stored in memory 18. After all the inputs are read, the discrete input states are reported using interface 130.

Turning in detail to FIG. 4, in step S342, upon power up the number of digital inputs 50 (shown in FIGS. 1 and 2) is determined as described above.

In step 344, the digital inputs (132) are latched into the digital input shift registers (72) using the digital input strobe (116).

In step S346, the stored digital input and the input discrete data is received serially via data input bus 234 (shown in FIGS. 1 and 2).

In step S348, the microcontroller 82 (shown in FIGS. 1 and 2) using software module 84, formats the digital data, in a predetermined pattern.

In step S350, digital data, is transmitted/sent/latched/shifted via external communication system 130 (shown in FIGS. 1 and 2), to the appropriate destination.

Figure 5:
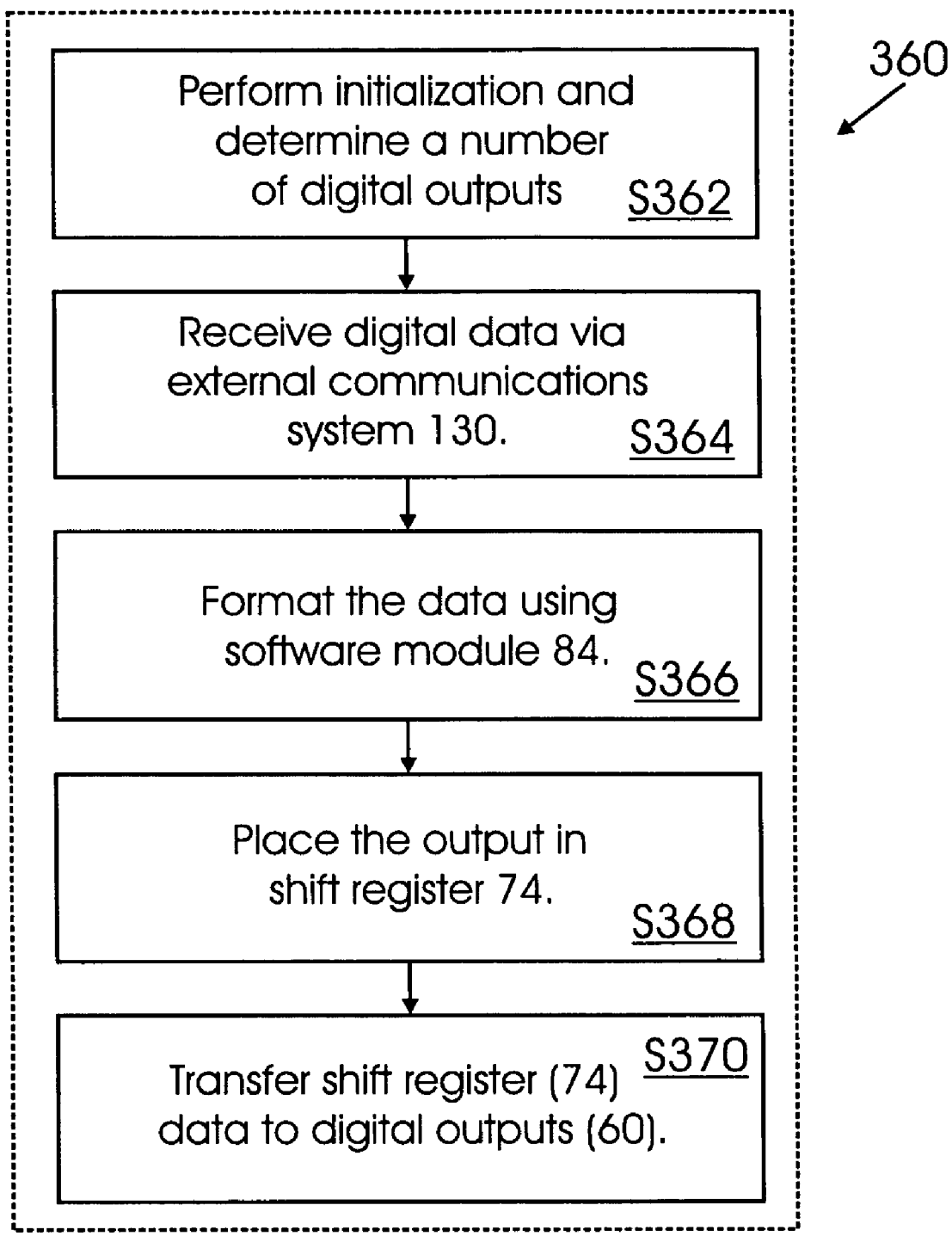
FIG. 5 is a flow chart of a method for processing digital outputs, according to another embodiment of the present invention.

Processing Digital Outputs:

FIG. 5 shows a flow chart of a method 360 for processing digital outputs 60 (shown in FIGS. 1 and 2). Digital output state information is received via external communication interface 130. A discrete output state is then setup via data output bus 112. A clock pulse is generated using clock signal 114. The output states are then shifted to digital out shift registers 74. Discrete output strobe 118 is pulsed to establish the state of the digital outputs 60. Thereafter, digital outputs 60 can be sent out to the appropriate destinations.

Turning in detail to FIG. 5, the method 360 comprises a step S362 of determining a number of digital outputs 60 upon power up, such as by reading digital out shift registers 74. This step is typically performed when system 10/10A are initialized upon power up or reset.

In step S364, the number of digital outputs is stored in memory and thereafter digital data is received from external communication system 130.

In step S366, the number of digital outputs is used to unpack the received data from external communication system (or sources) 130.

In Step S368, digital outputs are placed into digital out shift registers 74 (shown in FIGS. 1 and 2).

In step S370, digital outputs 60 are shifted (or transmitted/latched/sent) (shown in FIGS. 1 and 2) to the appropriate destination.

Figure 6:
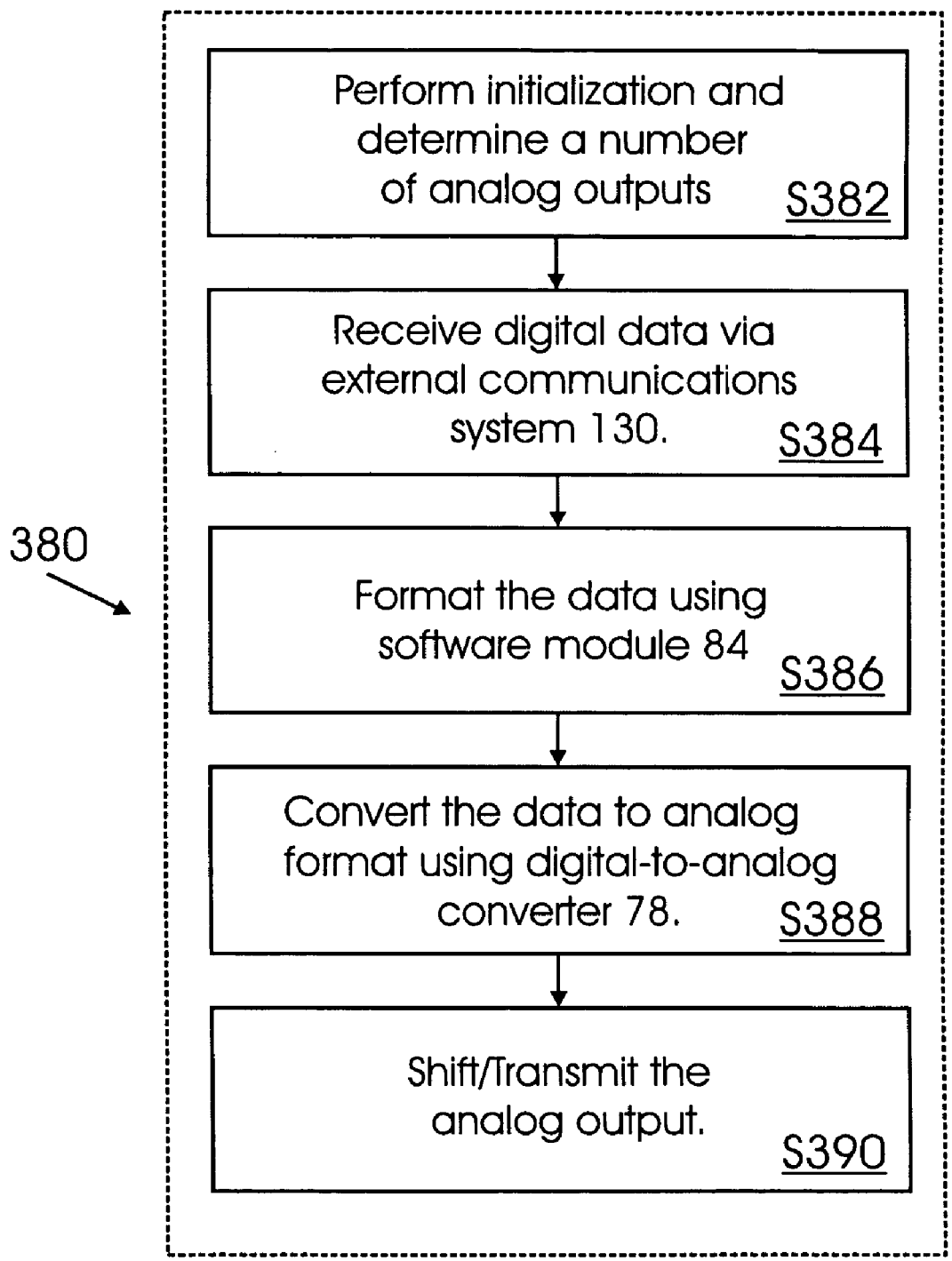
FIG. 6 is a flow chart of a method for processing analog outputs, according to another embodiment of the present invention.

Processing Analog Outputs:

FIG. 6 shows a flow chart of a method 380 for processing analog outputs 40 (shown in FIGS. 1 and 2). Analog output states are acquired from external communications interface 130. D/A converters 78 are controlled using configuration register 72B and configuration discrete inputs 76B. Configuration register 72B is accessed via data output bus 112 using D/A strobe 124 and D/A chip select 128. It is noteworthy that D/A chip select and strobe signals may not be needed depending on the type of D/A converter.

Turning in detail to FIG. 6, in step S382 a number of analog outputs 40 (shown in FIGS. 1 and 2), such as from counting the number of analog output pins or by reading the configuration shift register 72B is determined. This step is typically performed during power up/initialization.

In step S384, the number of digital output pins is stored and digital data is received. In step S386, software module 84 formats and processes the digital data. In step S388, D/A converter(s) 78 (shown in FIGS. 1 and 2) convert the digital data to an analog format.

In step S392, the analog data is shifted/transmitted to the appropriate destination.

Figure 7:
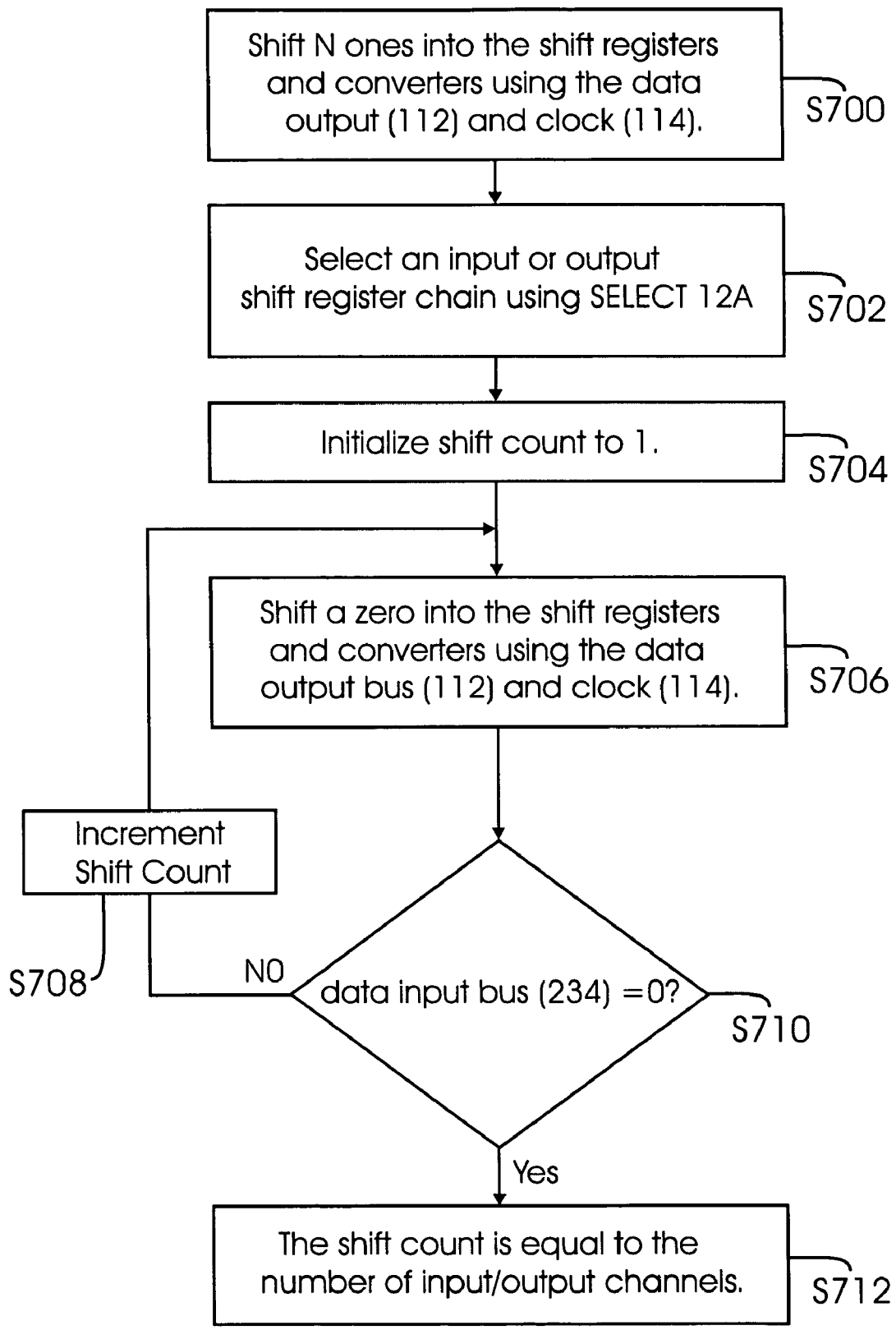
FIG. 7 is a flow chart of a method for initializing the system shown in FIG. 2 for determining the number of analog input/output and digital input/output, according to a further embodiment of the present invention.

Initialization:

FIG. 7 shows a flow chart of a method for initializing system 10A. System 10 (or 10A) upon power up determines the number of input devices and pins. The number of inputs and input types will determine how the data is packed on an output serial bus (such as data output bus 112 in FIGS. 1 and 2), during normal operation.

Turning in detail to FIG. 7, in step S700, N number of is (or zeros (0s)) is shifted into the shift registers of FIG. 2 (for example, registers 72, 72A, 72B and 74). Using clock signal 114 and data output bus 112 can perform this task. The number N is a large integer number that represents a maximum shift register chain length. This number can be preprogrammed.

In step S702, an input or output shift register is selected using the Select signal 12A.

In step S704, the shift count is initialized to 0. In step S706, a zero (or a 1, if 0s were shifted in step S700) is shifted into the shift registers and converted using data output bus 112 and clock 114.

In step S710, microcontroller 82 determines if the data input bus (234) has provided a zero. If a zero is not read, then the shift count is incremented (in step S708) and the process continues from step S706. If a zero is reached, then in step S712, the shift count is equal to the number of input/output channels.

In one aspect of the present invention, an integrated software module is provided that can process plural inputs from various sources to produce plural outputs for various destinations. This software module is scalable and can accommodate future varying number of inputs/outputs without expensive software upgrade/re-writes.

Although the present invention has been described with reference to specific embodiments, these embodiments are illustrative only and not limiting. Many other applications and embodiments of the present invention will be apparent in light of this disclosure and the following claims.

The invention claimed is:

1. A system on an aircraft for converting plural data inputs and plural data outputs from a parallel format to a serial format, comprising:

a microcontroller for executing code out of a memory module;

an integrated software module that accepts plural variable number of inputs and generates a plural variable number of outputs;

an analog input processing module that receives plural analog inputs, converts the analog inputs to digital data and sends the digital data to the integrated software module;

a digital input processing module that receives discrete digital inputs and transfers the digital inputs to the integrated software module;

a digital output module that receives data from the integrated software module, including a plurality of in-shift registers for receiving digital data from the integrated software module via a communication interface module; and an analog output module that receives digital data from the integrated software module and converts the digital data into analog data by using a digital to analog converter.

2. The system of claim 1, wherein a multiplexer coupled to the analog input processing module; the analog output processing module; the digital input processing module and the digital output processing module is used for transferring data to/from the integrated software module.

3. The system of claim 1 wherein the analog input processing module; the analog output processing module, the digital input processing module and the digital output processing module are coupled to each other serially for transferring data to the integrated software module.

4. The system of claim 1, wherein the analog inputs are received from flight deck modules.

5. The system of claim 1, wherein digital data is received from an external communication system and processed by the digital output processing module.

6. A method for processing plural data inputs and data outputs from a parallel to a serial format, comprising:

receiving analog inputs in parallel format;

acquiring information regarding the number and configuration of A/D converters;

converting the analog inputs to a digital format;

transferring the converted analog inputs to an integrated software module;

processing the converted analog inputs serially based on a destination format; and receiving digital inputs in parallel format; and transferring the digital inputs to the integrated software module via a multiplexer and/or serially.

* * * * *